United States Patent
Huang et al.

(10) Patent No.: US 12,068,220 B2
(45) Date of Patent: Aug. 20, 2024

(54) INTERFACE INTERCONNECT STRUCTURE FOR EFFICIENT HEAT DISSIPATION OF POWER ELECTRONIC DEVICE AND PREPARATION METHOD THEREFOR

(71) Applicant: Dalian University of Technology, Dalian (CN)

(72) Inventors: Mingliang Huang, Dalian (CN); Lin Zhu, Dalian (CN); Jing Ren, Dalian (CN); Feifei Huang, Dalian (CN)

(73) Assignee: Dalian University of Technology, Dalian (CN)

( * ) Notice: Subject to any disclaimer, the term of this patent is extended or adjusted under 35 U.S.C. 154(b) by 0 days.

(21) Appl. No.: 18/457,904

(22) Filed: Aug. 29, 2023

(65) Prior Publication Data
US 2024/0145336 A1    May 2, 2024

(51) Int. Cl.
*H01L 23/373*    (2006.01)
*H01L 21/48*    (2006.01)
*H01L 23/00*    (2006.01)

(52) U.S. Cl.
CPC ...... *H01L 23/3735* (2013.01); *H01L 21/4871* (2013.01); *H01L 23/3733* (2013.01); *H01L 24/32* (2013.01); *H01L 2224/32245* (2013.01); *H01L 2924/13055* (2013.01); *H01L 2924/13091* (2013.01)

(58) Field of Classification Search
None
See application file for complete search history.

(56) References Cited

U.S. PATENT DOCUMENTS

2009/0166893 A1*  7/2009  Okumura ............... H01L 24/33
                                                             257/784
2013/0134591 A1*  5/2013  Sakamoto ......... H01L 23/3735
                                                             257/746

FOREIGN PATENT DOCUMENTS

JP          2004298962 A   * 10/2004  ............ H01L 24/29

* cited by examiner

*Primary Examiner* — Michelle Mandala
*Assistant Examiner* — Jordan M Klein
(74) *Attorney, Agent, or Firm* — Wood Herron & Evans LLP

(57) ABSTRACT

An interface interconnect structure is provided for efficient heat dissipation of a power electronic device. The structure includes a first low temperature solder layer and a second low temperature solder layer, a metal-foam metal composite material is placed between the first low temperature solder layer and the second low temperature solder layer. The metal-foam metal composite material has designability in structure and performance. The thermal conductivity and coefficient of thermal expansion (CTE) of the thermal interface interconnect structure can be configured according to the selected encapsulating materials for a power electronic device, thereby achieving bisynchronous improvement in the heat dissipation efficiency and the CTE matching degree between the encapsulating materials. A remelting temperature of the interface interconnect structure is greater than melting points of the first low temperature solder layer and the second low temperature solder layer, achieving "low temperature soldering and high temperature service."

15 Claims, 10 Drawing Sheets

INTERFACE INTERCONNECT STRUCTURE FOR EFFICIENT HEAT DISSIPATION OF POWER ELECTRONIC DEVICE AND PREPARATION METHOD THEREFOR

CROSS REFERENCE TO RELATED APPLICATION

This patent application claims the benefit and priority of Chinese Patent Application No. 202211328767.8, filed on Oct. 27, 2022, the disclosure of which is incorporated by reference herein in its entirety.

TECHNICAL FIELD

This application relates to high-performance and high-density microelectronic encapsulation, and in particular, to an interface interconnect structure for efficient heat dissipation of a power electronic device and a preparation method therefor.

BACKGROUND

With the development of emerging areas such as new energy automobile, fifth-generation wireless (5G), PV, and radio frequency (RF) communication, device integration level has been gradually improved. Moreover, insulated gate bipolar transistor (IGBT) power electronic devices, and wide band gap (WBG) semiconductor devices with higher dielectric strength, higher switching frequency, higher operating temperature (greater than 500° C.) and higher performance have been developed into a stage of explosive growth and have a broad application prospect. However, power electronic device will generate heat during operation at high power. With the accumulation of heat, chip temperature will raise; in terms of the maximum junction temperature, rated temperature of an IGBT power electronic device is up to 175° C. and expected operating temperature of a WBG semiconductor device can be up to 300° C. Excessive temperature will make output power of the device reduced sharply such that the device cannot exert its performance. Therefore, heat dissipation has become the major problem to confine the application of power electronic device. Statistically, thermal fatigue failure caused by excessive heating accounts for 55%[1-3] (citations to references listed at the end of this section) (FIG. 17) of the IGBT device failures. The heat dissipation performance directly affects the performance and service life of a power electronic device product.

IGBT power electronic device is set as an example (FIG. 18), heat generated by a chip needs to be dissipated by a radiator. Thermal interface materials (TIMs) are located between a heater and a radiator and play an important role as a bridge in the process of heat transfer.

However, the existing TIMs hardly meet the demands for heat dissipation of power electronic device, which is mainly embodied in the following aspects:

A conventional heat dissipation material mainly includes a heat-conducting silica gel (0.4-4 W/m·K), a heat-conducting gel (2-5 W/m·K), a heat-conducting glue cushion (0.8-3 W/m·K) and a phase-change material (0.7-1.5 W/m·K), and the like[4-9]; these heat dissipation materials have a lower thermal conductivity which differs from the thermal conductivity (e.g., Cu: 398 W/m·K) of the adjacent device in several orders of magnitudes (Table 1) and have poor heat transfer performance, far from meeting the demands for heat dissipation of a high-performance chip.

TABLE 1

Thermal conductivity of each component of the power electronic device

| Material | Thermal conductivity coefficient (W/m · K) |
| --- | --- |
| IGBT (Si chip) | 116.0 |
| SiC | 270 |
| GaN | 200 |
| Cu layer upside the direct copper bonded (DCB) substrate | 393.0 |
| Ceramic layer in the middle of the DCB substrate | 170.0 |
| Cu layer downside the DCB substrate | 393.0 |
| Conventional heat dissipation material | 0.4-5 |
| Aluminum radiator | 235.0 |

The thermal conductivity of a lead-free solder can be up to 20-40 W/m·K[10-12], and the solder molten during soldering can fill in the interconnect interface between a power electronic device module and a radiator, thus achieving good thermal contact and reducing interface thermal resistance. However, there is a demand for a soldering process temperature greater than a melting point greater than a service temperature to a solder. On the one hand, the melting point of a solder as a TIM should be less than the melting point of the solder joint on electronics to avoid the remelting of the solder joint on the electronics, which greatly limits the selection for the solder of a thermal interface; on the other hand, the lead-free solder with a higher thermal conductivity generally has a melting point of greater than 200° C., and higher soldering temperature will cause thermal stress and even thermal damage on other devices on the substrate or the substrate itself, leading to a serious hidden danger to the stable service of subsequent electronics.

A stacked package structure is usually used for the power module, and materials between different layers have different coefficients of thermal expansion (CTEs), as shown in FIG. 19. The CTEs of the chip and the substrate material are less than 8 ppm/° C.; the lead-free solder TIMs have a CTE of 15-30 ppm/° C.; moreover, the difference of the CTEs between the power module and the radiator is prone to produce thermal stress. Therefore, the TIM layer as a bridge for heat dissipation becomes the weak point, which will affect the reliability of device in a long-term thermal cycle or power cycling.

TIM has become one of the bottlenecks in the improvement of heat dissipation performance of electronic products. It is urgent to develop a novel thermal interface material and an interconnect structure. A lower soldering temperature, high CTE matching degree, high thermal conductivity, high temperature resistance, and good high temperature reliability should be taken into account when a novel thermal interface material and an interconnect structure are designed.

References for the applications of a porous metal in TIMs in the prior art are as follows:

Porous metal materials both have the properties of a porous structure and a metal, and have excellent performance such as low density, large specific surface area, high thermal conductivity, high specific strength and high specific rigidity.

Chinese patent application CN114479773A has disclosed a composite thermal interface material composed of a metal foam and a liquid metal, which mainly solves the leakage of the liquid metal as TIM metal at high temperature by an inherent 3D continuous structure of the metal foam. Chinese patent applications CN102504769A and CN103965839A have disclosed the preparation of a more flexible thermal interface material with higher elasticity by the compressibility and flexibility of a porous metal foam, and material costs are reduced.

Chinese patent application CN108511407A has disclosed a thermal interface material and a preparation method, and an application method therefor. A thermal interface material with a sandwich structure is prepared by loading a low-melting-point metal and/or alloy on the upper/lower surface of a metal foam in ways such as electroplating, chemical plating, evaporation, sputtering, and ion plating, thus solving the heat dissipation problem of a power electronic device. However, the above patents fail to give sufficient consideration to the problem of low thermal conductivity of the metal foam in the air and thermal fatigue failure caused by great difference in the CTEs between the TIM and the adjacent encapsulating material.

In addition to the above technical solutions, references for the mismatch of coefficients of thermal expansion in TIMs are as follows:

Chinese patent CN1894791B has disclosed a thermal interface material and solder preforms. The TIM of the present invention minimizes the negative impact of the CTE mismatch by a CTE modifying component. Beneficial effects mentioned therein are as follows: "preferably, the CTE mismatch between the TIM and the substrate is between about 5 μm/m° C. and about 30 μm/m° C. More preferably, the CTE mismatch between the TIM and the substrate is between about 5 μm/m° C. and about 20 μm/m° C. Still more preferably, the CTE mismatch between the TIM and the substrate is less than about 10 μm/m° C.". Accordingly, when the TIM designed in the present patent is used, the CTE mismatch between the TIM and the substrate is within 2-20 ppm/° C.

REFERENCES

[1] Sheng K, Williams B W, Finney S J. A review of IGBT models [J]. IEEE Transactions on Power Electronics. 2000, 15(6):1250-1266.
[2] Williams, Finney, Jon S, et al. Review of IGBT models [J]. Power Electronics IEEE Transactions on. 2000, 15(6): 1250-1266.
[3] Smet V. Aging and failure modes of IGBT power modules undergoing power cycling in high temperature environments [D]. 2010.
[4] Wang B, Hu A, Tang Y. Junction temperature forecast and failure analysis of IGBT based on electro-thermal model [J]. Electric Machines & Control. 2012, 16(8):87-93.
[5] Luo X, Tang G F, Wen J L, et al. Over-current Failure Mechanism of IGBT Within Voltage Source Converter Based High Voltage Direct Current [J]. Zhongguo Dianji Gongcheng Xuebao/Proceedings of the Chinese Society of Electrical Engineering. 2009, 29(33):1-7.
[6] Yamamoto T, Adachi A, Umezawa K, et al. Research on efficient water-cooled heatsink for wind power generation system [C]. 2010.
[7] Mcnamara A J, Joshi Y K, Zhang Z M. CHARACTERIZATION OF NANOSTRUCTURED THERMAL INTERFACE MATERIALS-A REVIEW [C]. 2011.
[8] Jadhav S G, Deppisch C. Coated thermal interface in integrated circuit die [P].
[9] Hansson J, Zanden C, Ye L, et al. Review of current progress of thermal interface materials for electronics thermal management applications [C]. 2016.
[10] Jung D W, Kim J M, Yoon H W, et al. Solution-processable thermally conductive polymer composite adhesives of benzyl-alcohol-modified boronnitride two-dimensional nanoplates [J]. CHEMICAL ENGINEERING JOURNAL-LAUSANNE. 2019.
[11] Thermal Conductivity of Polymers and Their Nanocomposites [J]. Advanced Materials. 2018, 30(17).
[12] Gordon, Rachel. Thermal interface materials: opportunities and challenges for developers [J]. Translational Materials Research. 2015, 2(2):20301.
[13] Roy C K, Bhavnani S, Hamilton M C, et al. Investigation into the application of low melting temperature alloys as wet thermal interface materials [J]. International Journal of Heat and Mass Transfer. 2015, 85:996-1002.
[14] Dutta I, Raj R, Kumar P, et al. Liquid Phase Sintered Solders with Indium as Minority Phase for Next Generation Thermal Interface Material Applications [J]. Journal of Electronic Materials. 2009, 38(12):2735-2745.
[15] Vijay K. Solder-TIMs (Thermal Interface Materials) for superior thermal management in power electronics [C]. 2012.

SUMMARY

To satisfy the demands for high heat dissipation of a high-performance power electronic device and to solve the problems in the prior art such as low thermal conductivity, CTE mismatch, high soldering temperature and confined service temperature, the present disclosure provides an interface interconnect structure for efficient heat dissipation of a power electronic device and a preparation method therefor. The metal-foam metal composite material herein has designability in structure and performance. Moreover, the thermal conductivity and coefficient of thermal expansion (CTE) of the thermal interface interconnect structure can be configured according to the selected encapsulating material for a power electronic device, thereby achieving bisynchronous improvement of the heat dissipation efficiency and the CTE matching degree between the encapsulating materials. The present disclosure may effectively improve the thermal conductivity of the interconnect structure, to achieve "low temperature soldering and high temperature service", and has relatively simple preparation process and lower costs. The structure of the present disclosure may be not only used as a TIM between a power electronic device and a radiator, but also as a chip interconnect material for high temperature package.

To achieve the above objective, the present disclosure adopts the following technical solutions.

An interface interconnect structure for efficient heat dissipation of a power electronic device is provided; the interface interconnect structure includes a first low temperature solder layer and a second low temperature solder layer; a metal-foam metal composite material is placed between the first low temperature solder layer and the second low temperature solder layer; the first low temperature solder layer is located between an upper substrate and the metal-foam metal composite material; the second low temperature solder layer is located between the metal-foam metal composite material and a lower substrate; the first low temperature solder layer and the second low temperature solder layer have a preset thickness; the metal-foam metal composite material includes a high-melting high-thermal-conductive porous metal and a medium-high temperature lead-free solder, and has a preset thickness, a preset thermal conductivity, and a preset CTE; a ratio of the high-melting high-thermal-conductive porous metal to the medium-high temperature lead-free solder in the metal-foam metal composite material is adjusted such that the interface interconnect structure has a thermal conductivity of 60-250 W/m·K and a CTE of 12-25 ppm/° C.; a remelting temperature of the interface interconnect structure is adjusted to a preset value by selecting metal-foam metal composite materials with different physical and chemical properties as well as first low temperature solder layers and second low temperature solder layers that each have different physical and chemical properties; in a process of reflow soldering and subsequent service, melting point depressant elements in the first low temperature solder layer and the second low temperature solder layer are subjected to bidirectional diffusion with the medium-high temperature lead-free solder in the metal-foam metal composite material such that the remelting temperature of the interface interconnect structure is greater than melting points of the first low temperature solder layer and the second low temperature solder layer, and less than a melting point of the medium-high temperature lead-free solder in the metal-foam metal composite material, to achieve low temperature soldering and high temperature service.

Further, a metallic matrix of the high-melting high-thermal-conductive porous metal includes Cu, Ag, Al, and Mg.

Further, the high-melting high-thermal-conductive porous metal has a porosity of 20-90%.

Further, the high-melting high-thermal-conductive porous metal has a pore size of 20-200 μm.

Further, the metal-foam metal composite material has a thickness of 20-500 μm.

Further, the medium-high temperature lead-free solder includes a component selected from the group consisting of any one of pure Sn, Sn—Ag—Cu, Sn—Ag, Sn—Cu, and Au—Sn, or an alloy that is formed by adding any one of Ni, Sb, and Zn to the above component, and has a melting point of greater than 200° C. and a thermal conductivity of greater than 20 W/m·K.

Further, the first low temperature solder layer and the second low temperature solder layer each have a thickness of 5-50 μm.

Further, the low temperature solder includes a component selected from the group consisting of any one of Sn—Bi, Sn—In, Sn—Bi—In, and Ag—In, or is formed by adding any one of Cu, Ag, Ga, and Sb to the above component such that the metal-foam metal composite material is not molten within a soldering temperature range of the low temperature solder.

The upper substrate/first low temperature solder layer/metal-foam metal composite material/second low temperature solder layer/lower substrate of the interconnect structure is subjected to reflow soldering at a soldering temperature of the first low temperature solder layer and the second low temperature solder layer, to achieve metallurgical bonding.

The metal-foam metal composite material in the interconnect structure herein is not molten within the scope of soldering temperature of the low temperature solder. During reflow soldering, the first low temperature solder layer and the second low temperature solder layer are molten simultaneously, of which the first low temperature solder layer achieves metallurgical bonding between the upper substrate and the metal-foam metal composite material, and the second low temperature solder layer achieves metallurgical bonding between the lower substrate and the metal-foam metal composite material.

The present disclosure further discloses a method for preparing the interface interconnect structure for efficient heat dissipation of a power electronic device described above, specifically including the following steps:

step 1: preparing the metal-foam metal composite material, cleaning the selected high-melting high-thermal-conductive porous metal in acetone or ethanol for 5-10 min, soaking into a liquid fluxing agent after vacuum drying, and soaking into a molten medium-high temperature lead-free solder, and taking out, then cooling to form the metal-foam metal composite material;

the high-melting high-thermal-conductive porous metal is soaked into the liquid fluxing agent for 3-5 min;

the high-melting high-thermal-conductive porous metal is soaked into the molten medium-high temperature lead-free solder for 5 s–1 min;

step 2: placing the metal-foam metal composite material between the first low temperature solder layer and the second low temperature solder layer, to form an interconnect structure of the upper substrate/the first low temperature solder layer/the metal-foam metal composite material/the second low temperature solder layer/the lower substrate from top to bottom;

the upper substrate is a power electronic device selected from the group consisting of a metal-oxide semiconductor field effect transistor (MOSFET) discrete device, an IGBT power module, and a wide band gap (WBG) semiconductor device;

the lower substrate is a heat sink material for a power electronic device that is selected from the group consisting of aluminum, copper, and a copper alloy;

the first low temperature solder layer and the second low temperature solder layer may include a same or different low temperature solders;

the first low temperature solder layer and the second low temperature solder layer may be a low temperature solder preformed sheet, and a fluxing agent needs to be coated at both sides when a preformed sheet is used;

the first low temperature solder layer and the second low temperature solder layer may be each a low temperature solder paste that is coated on the upper substrate and the lower substrate in a steel mesh printing way when used;

step 3: putting the interconnect structure of the upper substrate/the first low temperature solder layer/the metal-foam metal composite material/the second low temperature solder layer/the lower substrate to a reflow soldering device, and performing soldering under a protective atmosphere according to a required process time and temperature;

the protective atmosphere is one of vacuum, argon, hydrogen, and nitrogen;

the reflow soldering temperature ranges above highest melting points of the first low temperature solder layer and the second low temperature solder layer, and is 10-50° C. greater than a melting point of a low temperature solder; and the reflow soldering time is 30 s–10 min.

The obtained interface interconnect structure for efficient heat dissipation based on the metal-foam metal composite material may work at a temperature that is greater than melting points of the first low temperature solder layer and the second low temperature solder layer and is less than a melting point of the medium-high temperature lead-free solder in the metal-foam metal composite material.

Compared with the prior art, the present disclosure has the follow advantages.

The interface interconnect structure for efficient heat dissipation of a power electronic device has designability in structure. The metal-foam metal composite material keeps solid during the reflow soldering, which may effectively adjust a standoff height of 30-500 μm. To increase the standoff height properly may decrease the shear stress of the interconnect structure due to temperature variation during service process, thus improving the service stability of the power electronic device.

The metal-foam metal composite material in the interface interconnect structure for efficient heat dissipation of a power electronic device herein has designability in performance. A ratio of the high-melting high-thermal-conductive porous metal to the medium-high temperature lead-free solder in the metal-foam metal composite material is adjusted such that the designed interface interconnect structure has a thermal conductivity of 60-250 W/m·K (the thermal conductivity of a conventional TIM is 0.4-5 W/m·K) and a CTE of 12-25 ppm/° C. The thermal conductivity and CTE of the thermal interface interconnect structure may be configured according to the selected encapsulating material for a power electronic device, thereby increasing the CTE matching degree between the encapsulating materials, reducing thermal mismatch, decreasing residual thermal stress of the interconnect structure, and improving the high-temperature service stability of the power electronic device. Meanwhile, the present disclosure further solves the problems existing in the technical solutions in the art such as low thermal conductivity and low CTE matching degree of TIMs. A common IGBT power module for new energy automobile is set as an example. The IGBT power module has an equivalent CTE of about 10 ppm/° C., and a Cu radiator has a CTE of 17 ppm/° C. When a lead-free solder serves as a TIM (thermal conductivity: 19-67 W/m·K and CTE: 15-30 ppm/° C.), the CTE mismatch between the IGBT module and the lead-free solder TIM is about 5-20 ppm/° C., and the CTE mismatch between the lead-free solder TIM and Cu radiator is about 0-13 ppm/° C. When the technical solution (thermal conductivity: 60-250 W/m·K and CTE: 12-25 ppm/° C.) herein is adopted, the CTE mismatch between the IGBT module and the TIM herein decreases to 2-15 ppm/° C., and the CTE mismatch between the TIM herein and Cu radiator is about 0-8 ppm/° C. The technical solution herein may improve the thermal conductivity and CTE matching degree between different materials.

The present disclosure avoids the melting of the high-melting-point metal-foam metal composite material during reflow soldering. The interconnection between the upper substrate and the lower substrate is achieved via low temperature solder layers at a lower soldering temperature. During reflow soldering, melting point depressant elements at both sides of the low temperature solders are subjected to bidirectional diffusion with the medium-high temperature lead-free solder in the metal-foam metal composite material such that the remelting temperature of the whole interface interconnect structure is greater than the low temperature solders. That is, the interconnect structure may work at a temperature that is greater than the melting points of the low temperature solders and less than a melting point of the lead-free solder in the metal-foam metal composite material, to achieve "low temperature soldering and high temperature service". The remelting temperature of the interface interconnect structure may be up to a preset value by adjusting the thickness of the low temperature solder layers and the metal-foam metal composite material layer. The remelting temperature of the interface interconnect structure is preset by adjusting the thicknesses of a low temperature solder paste or a low temperature solder preformed sheet and the metal-foam metal composite material. Such a configuration may not only solve the problems in the existing technical solutions, such as high soldering temperature and confined service temperature, but also achieve simple process and low costs.

BRIEF DESCRIPTION OF THE DRAWINGS

The accompanying drawings, which are incorporated in and constitute a part of this specification, illustrate one or more embodiments of the invention and, together with a general description of the invention given above, and the detailed description given below, serve to explain the invention.

DETAILED DESCRIPTION

Figure 1:
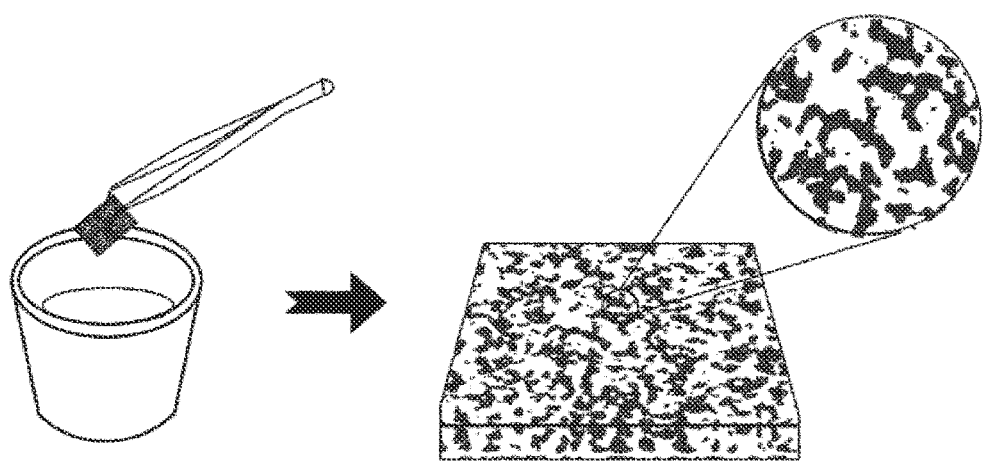
FIG. 1 is a schematic diagram showing a preparation process of a metal-foam metal composite material according to one embodiment of the present disclosure.

It should be noted that the embodiments in the present disclosure or features in the embodiments may be combined in a non-conflicting manner. The present disclosure will be described in detail below with reference to the accompanying drawings and the examples.

To make the technical solutions and advantages of the embodiments of the present disclosure clearer, the technical solutions in examples of the present disclosure are clearly and completely described below with reference to the accompanying drawings in embodiments of the present disclosure. Apparently, the described examples are merely some rather than all of the embodiments of the present disclosure. The following description of at least one exemplary example is merely illustrative, and not intended to limit the present disclosure and application or use thereof in any way. All other embodiments obtained by a person of ordinary skill in the art based on the embodiments of the present disclosure without creative efforts shall fall within the protection scope of the present disclosure.

It should be noted that the terms used herein are merely used for describing the specific implementations, but are not intended to limit exemplary implementations of the present disclosure. As used herein, the singular form is also intended to include the plural form unless otherwise indicated obviously from the context. Furthermore, it should be further understood that the terms "include" and/or "comprise" used in this specification specify the presence of features, steps, operations, devices, components and/or a combination thereof.

Unless otherwise specified, the relative arrangement, numerical expressions and numerical values of components and steps set forth in these examples do not limit the scope of the present disclosure. Meanwhile, it should be understood that for ease of description, the dimension of each portion in the accompanying drawings is not necessarily drawn to the actual scale. The technologies, methods, and equipment known to those skilled in the art may not be discussed in detail, but where appropriate, the technologies, methods, and equipment should be regarded as part of the authorized specification. In all examples shown and discussed herein, any specific value should be interpreted as merely exemplary, rather than restrictive. Therefore, other examples of the exemplary examples may have different values. It should be noted that similar reference signs and letters represent similar items in the accompanying drawings below. Therefore, once an item is defined in one drawing, it does not need to be further discussed in subsequent drawings.

In addition, it needs to be noted that the use of such words as "first" and "second" to define components is merely intended to distinguish the corresponding components. Unless otherwise stated, such words have no special meaning and thus cannot be construed as limiting the protection scope of the present disclosure.

An interface interconnect structure for efficient heat dissipation of a power electronic device is provided; the interface interconnect structure includes a first low temperature solder layer and a second low temperature solder layer; a metal-foam metal composite material is placed between the first low temperature solder layer and the second low temperature solder layer; the first low temperature solder layer is located between an upper substrate and the metal-foam metal composite material; the second low temperature solder layer is located between the metal-foam metal composite material and a lower substrate; the first low temperature solder layer and the second low temperature solder layer have a preset thickness; the metal-foam metal composite material includes a high-melting high-thermal-conductive porous metal and a medium-high temperature lead-free solder, and has a preset thickness, a preset thermal conductivity, and a preset CTE; a remelting temperature of the interface interconnect structure is adjusted to a preset value by selecting a metal-foam metal composite material and adjusting the thicknesses of the first low temperature solder layer and the second low temperature solder layer.

Further, a metallic matrix of the high-melting high-thermal-conductive porous metal includes Cu, Ag, Al, and Mg.

Further, the high-melting high-thermal-conductive porous metal has a porosity of 20-90%.

Further, the high-melting high-thermal-conductive porous metal has a pore size of 20-200 μm.

Further, the metal-foam metal composite material has a thickness of 20-500 μm.

Further, the first low temperature solder layer and the second low temperature solder layer each have a thickness of 5-50 μm and 5-50 μm, respectively; where the thicknesses of the first low temperature solder layer and the second low temperature solder layer may be same or different.

The upper substrate/first low temperature solder layer/metal-foam metal composite material/second low temperature solder layer/lower substrate of the interconnect structure is subjected to reflow soldering at a soldering temperature of the first low temperature solder layer and the second low temperature solder layer, to achieve metallurgical bonding.

The metal-foam metal composite material in the interconnect structure herein is not molten within the scope of soldering temperature of the low temperature solder. During reflow soldering, the first low temperature solder layer and the second low temperature solder layer are molten simultaneously, of which the first low temperature solder layer achieves metallurgical bonding between the upper substrate and the metal-foam metal composite material, and the second low temperature solder layer achieves metallurgical bonding between the lower substrate and the metal-foam metal composite material.

Figure 2:
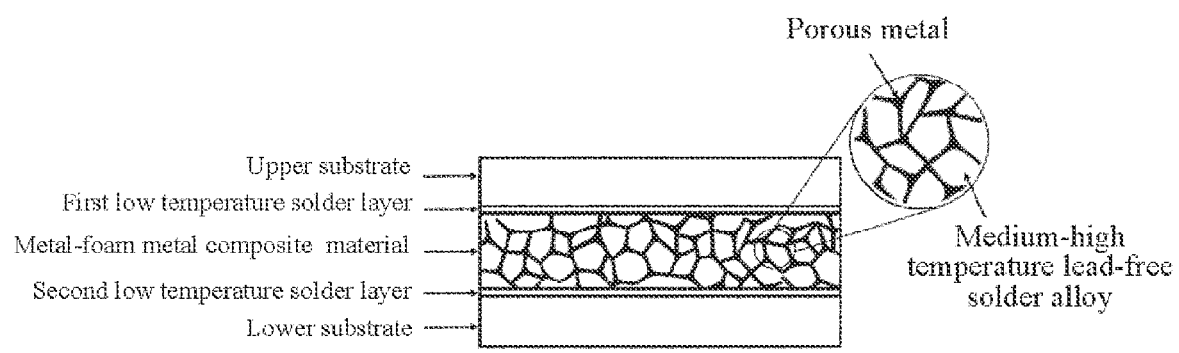
FIG. 2 is a schematic diagram showing an interface interconnect structure according to the present disclosure.

The present disclosure further discloses a method for preparing the interface interconnect structure for efficient heat dissipation of a power electronic device described above, specifically including the following steps:

step 1: preparing the metal-foam metal composite material, cleaning the selected high-melting high-thermal-conductive porous metal in acetone or ethanol for 5-10 min, soaking into a liquid fluxing agent after vacuum drying, and soaking into a molten medium-high temperature lead-free solder, and taking out, then cooling to form the metal-foam metal composite material, as shown in FIG. 1;

the high-melting high-thermal-conductive porous metal is soaked into the liquid fluxing agent for 3-5 min;

the medium-high temperature lead-free solder includes a component selected from the group consisting of any one of pure Sn, Sn—Ag—Cu, Sn—Ag, Sn—Cu, and Au—Sn, or an alloy that is formed by adding any one of Ni, Sb, and Zn to the above component, and has a melting point of greater than 200° C. and a thermal conductivity of greater than 20 W/m·K;

the high-melting high-thermal-conductive porous metal is soaked into the molten medium-high temperature lead-free solder for 5 s–1 min;

step 2: placing the metal-foam metal composite material between the first low temperature solder layer and the second low temperature solder layer, to form an interconnect structure of the upper substrate/the first low temperature solder layer/the metal-foam metal composite material/the second low temperature solder layer/the lower substrate from top to bottom, as shown in FIG. 2;

the low temperature solder includes a component selected from the group consisting of any one of Sn—Bi, Sn—In, Sn—Bi—In, and Ag—In, or is formed by adding any one of Cu, Ag, Ga, and Sb to the above component such that the metal-foam metal composite material is not molten within a soldering temperature range of the low temperature solder;

the upper substrate may be a power electronic device selected from the group consisting of a MOSFET discrete device, an IGBT power module, and a WBG semiconductor device.

the lower substrate is a heat sink material for a power electronic device that is selected from the group consisting of aluminum, copper, and a copper alloy;

the first low temperature solder layer and the second low temperature solder layer may include a same or different low temperature solders;

the first low temperature solder layer and the second low temperature solder layer may be a low temperature solder preformed sheet, and a fluxing agent needs to be coated at both sides when a preformed sheet is used;

the first low temperature solder layer and the second low temperature solder layer may be each a low temperature solder paste that is coated on the upper substrate and the lower substrate in a steel mesh printing way when used;

step 3: putting the interconnect structure of the upper substrate/the first low temperature solder layer/the metal-foam metal composite material/the second low temperature solder layer/the lower substrate to a reflow soldering device, and performing soldering under a protective atmosphere according to a required process time and temperature.

The protective atmosphere is one of vacuum, argon, hydrogen, and nitrogen; the reflow soldering temperature ranges above highest melting points of the first low temperature solder layer and the second low temperature solder layer, and is 10-50° C. greater than a melting point of a low temperature solder; the reflow soldering time is 30 s–10 min; and the obtained interface interconnect structure for efficient heat dissipation based on the metal-foam metal composite material may work at a temperature that is greater than melting points of the first low temperature solder layer and the second low temperature solder layer and is less than a melting point of the medium-high temperature lead-free solder in the metal-foam metal composite material.

Example 1

Figure 3:
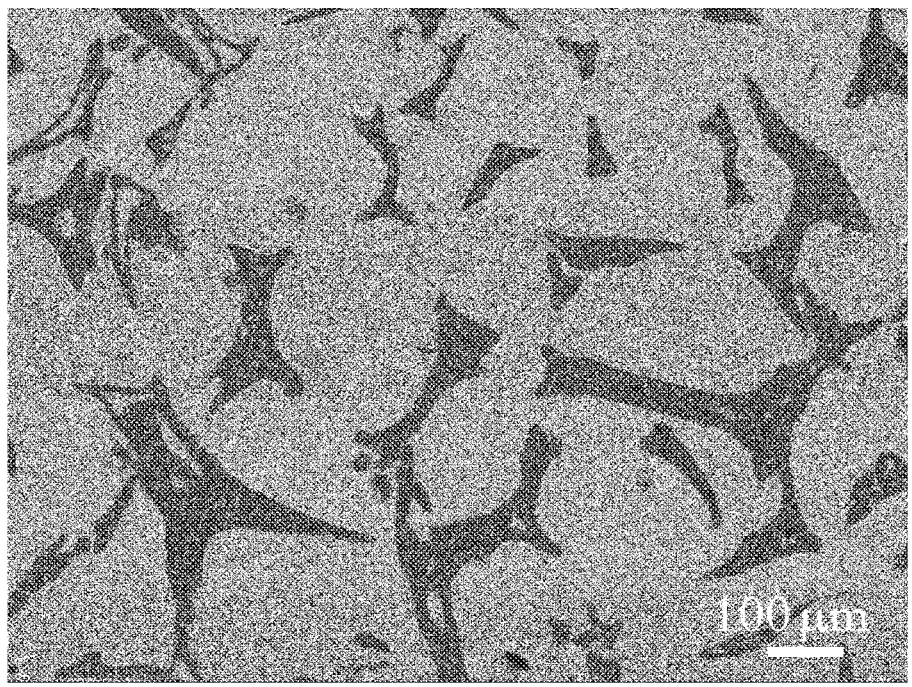
FIG. 3 shows a microstructure of a metal-foam metal composite material prepared in step 1 of Example 1 of the present disclosure.

The interface interconnect structure for efficient heat dissipation of a power electronic device and the preparation method therefor may be achieved by the following steps:

Step 1: preparation of a metal-foam metal composite material: a porous metal Cu having a thickness of 120 μm, a porosity of 76% and a pore size of 60 μm and pure Sn (melting point: 232° C.) were selected to prepare the metal-foam metal composite material; the selected porous metal Cu was cleaned in acetone for 5-10 min, and subjected to vacuum drying and soaked into a liquid fluxing agent, and then soaked into molten Sn for 10 s, and then taken out, and cooled to obtain the metal-foam metal composite material. The microstructure is shown in FIG. 3. Measured by a thermal conductivity meter (Hot Disk TPS2500), the thermal conductivity and the CTE at 150° C. of the prepared metal-foam metal composite material were 68.6 W/m·K and 20.6 ppm/° C., respectively.

Step 2: 5 μm of a Sn-58Bi (melting point: 138° C.) solder paste was selected as a low temperature solder layer, pure Cu was selected as an upper substrate and pure Al (a radiator) served as a lower substrate; then the upper low temperature solder layer Sn-58Bi, the metal-foam metal composite material, and the lower low temperature solder layer Sn-58Bi were placed between both sides of the substrates, to form an interconnect structure.

Figure 4:
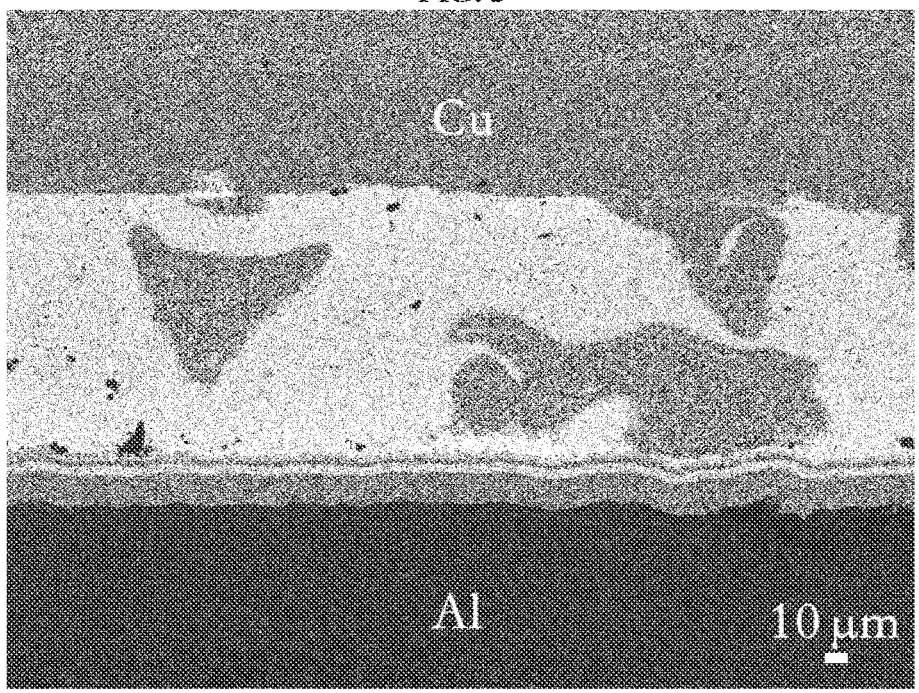
FIG. 4 shows a microstructure of a Cu/Sn-58Bi/metal-foam metal composite material/Sn-58Bi/Al soldering interface formed in Example 1 of the present disclosure.

Step 3: the interconnect structure was put to a reflow soldering device and soldered in vacuum at a reflow soldering temperature of 180° C. for 5 min. The obtained interconnect structure has a microstructure as shown in FIG. 4.

The remelting temperature of the interconnect structure was determined by a differential scanning calorimetry (DSC), being about 210° C. After being soldered, the metal-foam metal composite material layer containing Bi had a thermal conductivity of 57.6 W/m·K.

Example 2

Figure 5:
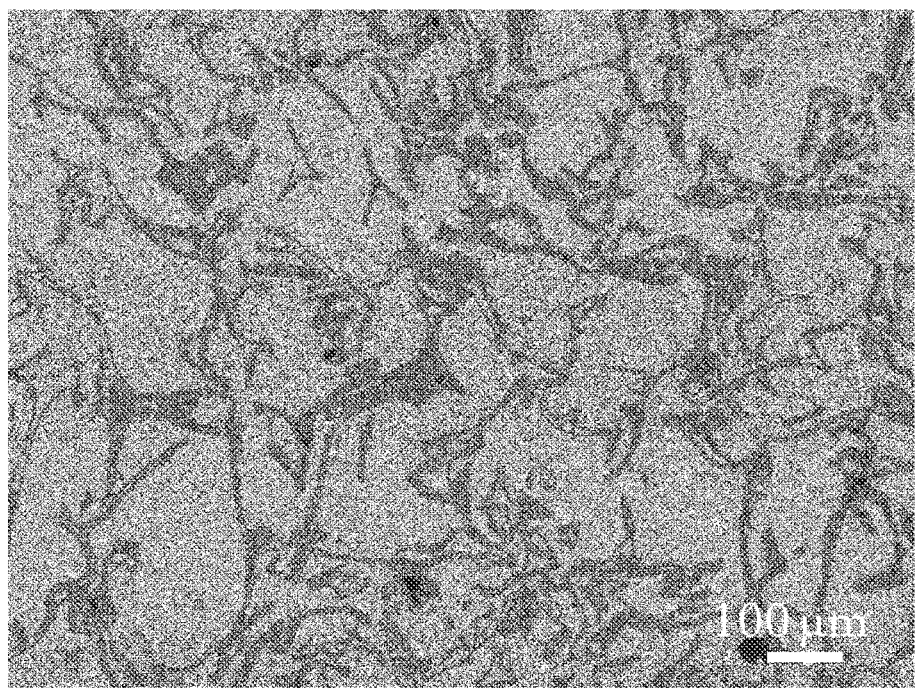
FIG. 5 shows a microstructure of a metal-foam metal composite material prepared in step 1 of Example 2 of the present disclosure.

The interface interconnect structure for efficient heat dissipation of a power electronic device and the preparation method therefor may be achieved by the following steps:

Step 1: preparation of a metal-foam metal composite material: a porous metal Cu having a thickness of 115 μm, a porosity of 72% and a pore size of 32 μm and pure Sn (melting point: 232° C.) were selected to prepare the metal-foam metal composite material; the selected porous metal Cu was cleaned in acetone for 5-10 min, and subjected to vacuum drying and soaked into a liquid fluxing agent, and then soaked into molten Sn for 10 s, and then taken out, and cooled to obtain the metal-foam metal composite material. The microstructure is shown in FIG. 5. Measured by a thermal conductivity meter (Hot Disk TPS2500), the thermal conductivity and the CTE at 150° C. of the prepared metal-foam metal composite material were 74.5 W/m·K and 19.2 ppm/° C., respectively.

Step 2: 5 μm of a Sn-58Bi (melting point: 138° C.) solder paste was selected as a low temperature solder layer, pure Cu was selected as an upper substrate and pure Al (a radiator) served as a lower substrate; then the upper low temperature solder layer Sn-58Bi, the metal-foam metal composite material, and the lower low temperature solder layer Sn-58Bi were placed between both sides of the substrates, to form an interconnect structure.

Figure 6:
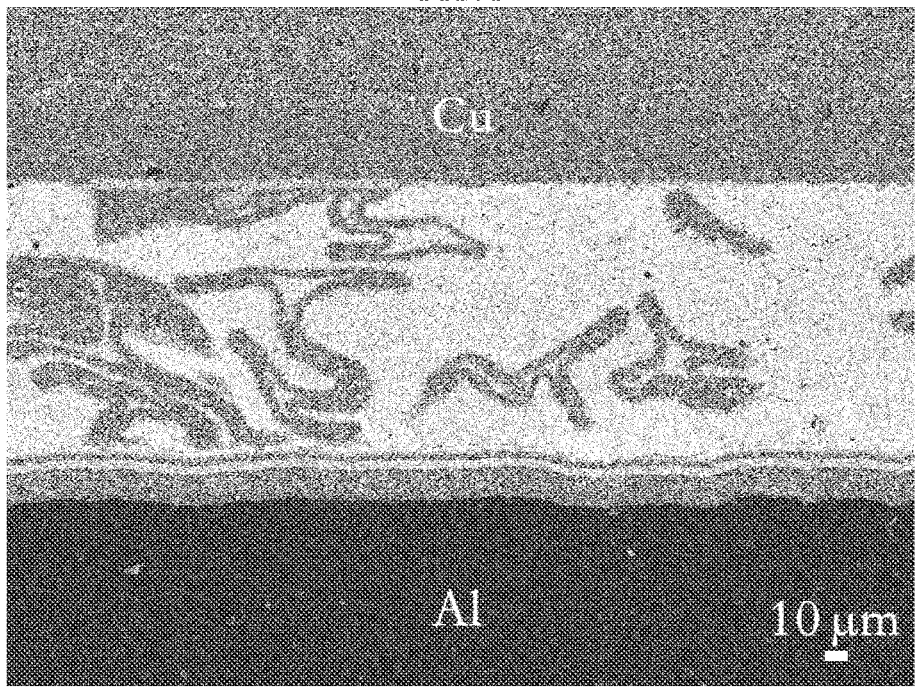
FIG. 6 shows a microstructure of a Cu/Sn-58Bi/metal-foam metal composite material/Sn-58Bi/Al soldering interface formed in Example 2 of the present disclosure.

Step 3: the interconnect structure was put to a reflow soldering device and soldered in vacuum at a reflow soldering temperature of 170° C. for 5 min. The obtained interconnect structure has a microstructure as shown in FIG. 6.

The remelting temperature of the interconnect structure was determined, being about 213° C. After being soldered, the metal-foam metal composite material layer containing Bi had a thermal conductivity of 67.3 W/m·K.

Example 3

Figure 7:
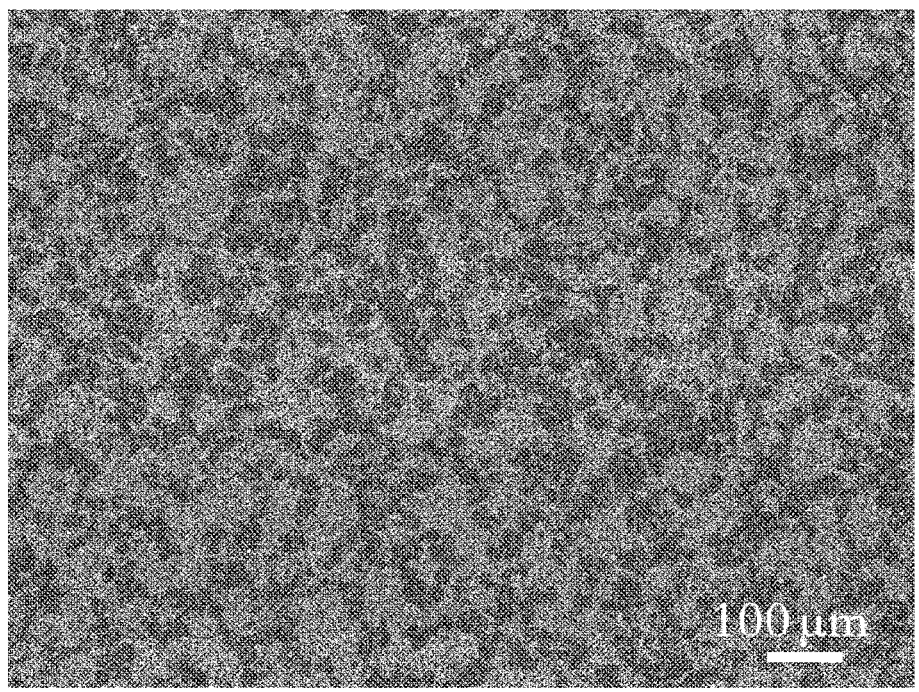
FIG. 7 shows a microstructure of a metal-foam metal composite material prepared in step 1 of Example 3 of the present disclosure.

The interface interconnect structure for efficient heat dissipation of a power electronic device and the preparation method therefor may be achieved by the following steps:

Step 1: preparation of a metal-foam metal composite material: a porous metal Cu having a thickness of 105 μm, a porosity of 65% and a pore size of 30 μm and pure Sn (melting point: 232° C.) were selected to prepare the metal-foam metal composite material; the selected porous metal Cu was cleaned in acetone for 5-10 min, and subjected to vacuum drying and soaked into a liquid fluxing agent, and then soaked into molten Sn for 10 s, and then taken out, and cooled to obtain the metal-foam metal composite material. The microstructure is shown in FIG. 7. Measured by a thermal conductivity meter (Hot Disk TPS2500), the thermal conductivity and the CTE at 150° C. of the prepared metal-foam metal composite material were 87.6 W/m·K and 17.7 ppm/° C., respectively.

Step 2: 5 μm of a Sn-58Bi (melting point: 138° C.) solder paste was selected as a low temperature solder layer, pure Cu was selected as an upper substrate and pure Al (a radiator) served as a lower substrate; then the upper low temperature solder layer Sn-58Bi, the metal-foam metal composite material, and the lower low temperature solder layer Sn-58Bi were placed between both sides of the substrates, to form an interconnect structure.

Figure 8:
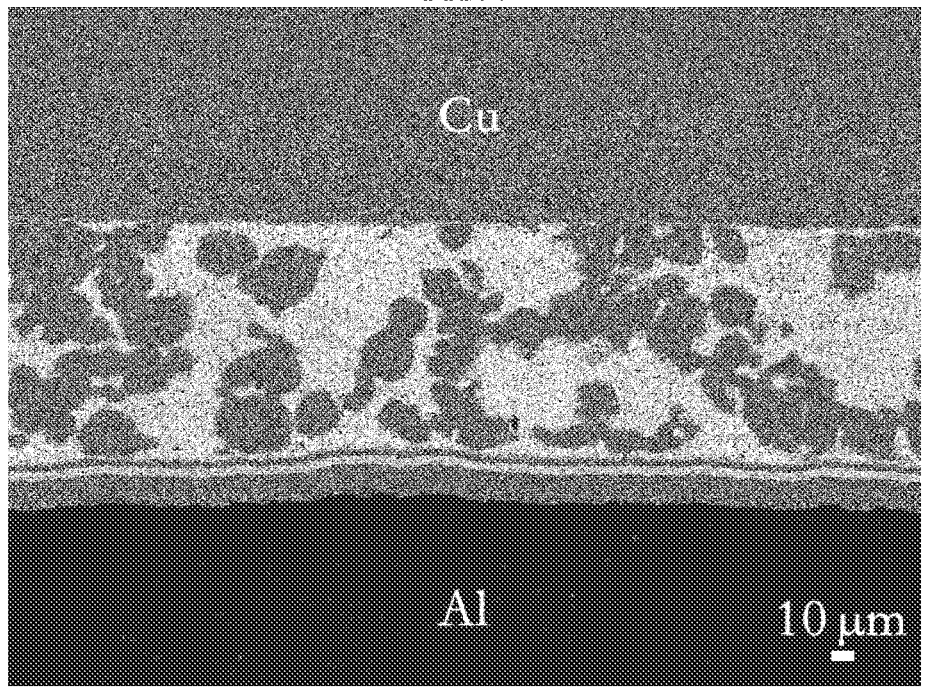
FIG. 8 shows a microstructure of a Cu/Sn-58Bi/metal-foam metal composite material/Sn-58Bi/Al soldering interface formed in Example 3 of the present disclosure.

Step 3: the interconnect structure was put to a reflow soldering device and soldered in vacuum at a reflow soldering temperature of 180° C. for 5 min. The obtained interconnect structure has a microstructure as shown in FIG. 8.

The remelting temperature of the interconnect structure was determined, being about 205° C. After being soldered, the metal-foam metal composite material layer containing Bi had a thermal conductivity of 80.6 W/m·K.

Example 4

Figure 9:
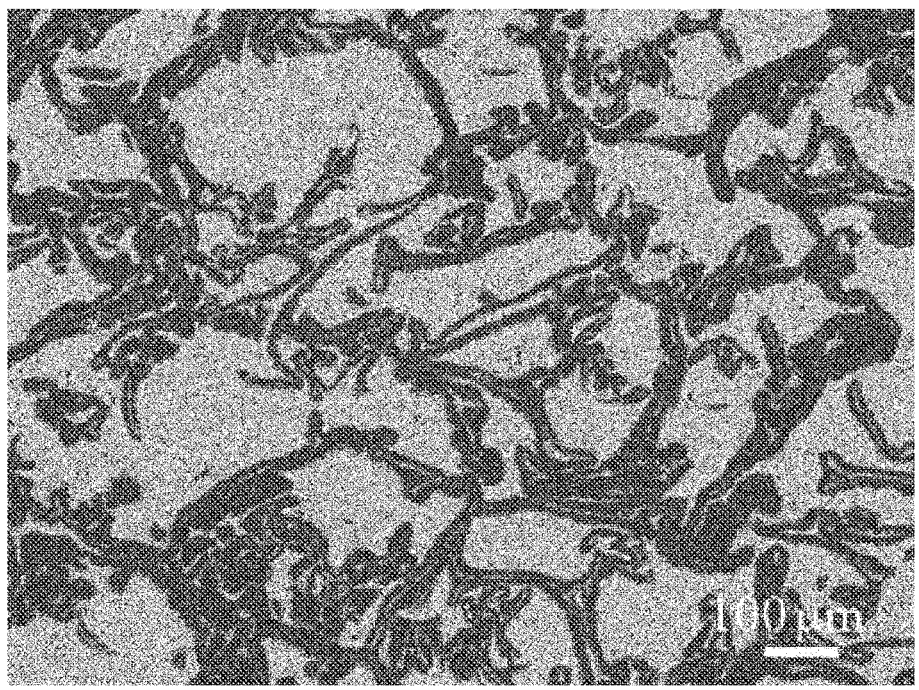
FIG. 9 shows a microstructure of a metal-foam metal composite material prepared in Example 4 of the present disclosure.

The interface interconnect structure for efficient heat dissipation of a power electronic device and the preparation method therefor may be achieved by the following steps:

Step 1: preparation of a metal-foam metal composite material: a porous metal Cu having a thickness of 130 μm, a porosity of 65% and a pore size of 60 μm and pure Sn (melting point: 232° C.) were selected to prepare the metal-foam metal composite material; the selected porous metal Cu was cleaned in acetone for 5-10 min, and subjected to vacuum drying and soaked into a liquid fluxing agent, and then soaked into molten Sn for 10 s, and then taken out, and cooled to obtain the metal-foam metal composite material. The microstructure is shown in FIG. 9. Measured by a thermal conductivity meter (Hot Disk TPS2500), the thermal conductivity and the CTE at 150° C. of the prepared metal-foam metal composite material were 86.9 W/m·K and 18.5 ppm/° C., respectively.

Step 2: 10 μm of a Sn-58Bi (melting point: 138° C.) preformed sheet was selected as a low temperature solder layer, pure Cu was selected as an upper substrate and pure Al (heat sink) served as a lower substrate; then the upper low temperature solder layer Sn-58Bi, the metal-foam metal composite material, and the lower low temperature solder layer Sn-58Bi were placed between both sides of the substrates, to form an interconnect structure.

Figure 10:
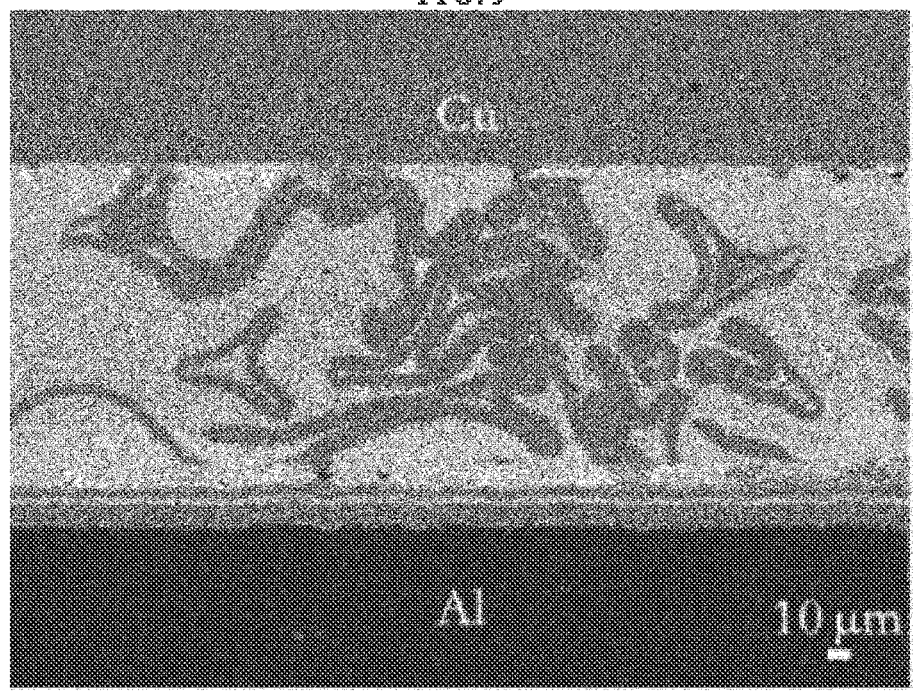
FIG. 10 shows a microstructure of a Cu/Sn-58Bi/metal-foam metal composite material/Sn-58Bi/Al soldering interface formed in Example 4 of the present disclosure.

Step 3: the interconnect structure was put to a reflow soldering device and soldered in vacuum at a reflow soldering temperature of 170° C. for 5 min. The obtained interconnect structure has a microstructure as shown in FIG. 10.

The remelting temperature of the interconnect structure was determined, being about 184.2° C. After being soldered, the metal-foam metal composite material layer containing Bi had a thermal conductivity of 67.6 W/m·K.

Example 5

Figure 11:
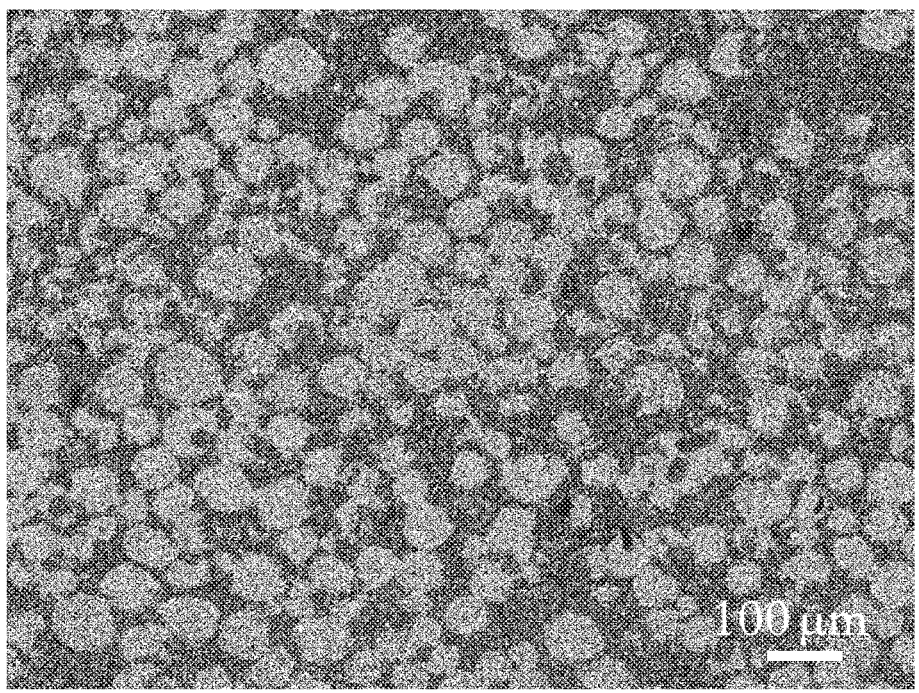
FIG. 11 shows a microstructure diagram of a metal-foam metal composite material prepared in Example 5 of the present disclosure.

The interface interconnect structure for efficient heat dissipation of a power electronic device and the preparation method therefor may be achieved by the following steps:

Step 1: preparation of a metal-foam metal composite material: a porous metal Cu having a thickness of 110 μm, a porosity of 60% and a pore size of 22 μm and pure Sn (melting point: 232° C.) were selected to prepare the metal-foam metal composite material; the selected porous metal Cu was cleaned in acetone for 5-10 min, and subjected to vacuum drying and soaked into a liquid fluxing agent, and then soaked into molten Sn for 10 s, and then taken out, and cooled to obtain the metal-foam metal composite material. The microstructure is shown in FIG. 11. Measured by a thermal conductivity meter (Hot Disk TPS2500), the thermal conductivity and the CTE at 150° C. of the prepared metal-foam metal composite material were 98.4 W/m·K and 17.6 ppm/° C., respectively.

Step 2: 5 μm of a Sn-58Bi (melting point: 138° C.) solder paste was selected as a low temperature solder layer, pure Cu was selected as an upper substrate and pure Al (a radiator) served as a lower substrate; then the upper low temperature solder layer Sn-58Bi, the metal-foam metal composite material, and the lower low temperature solder layer Sn-58Bi were placed between both sides of the substrates, to form an interconnect structure.

Figure 12:
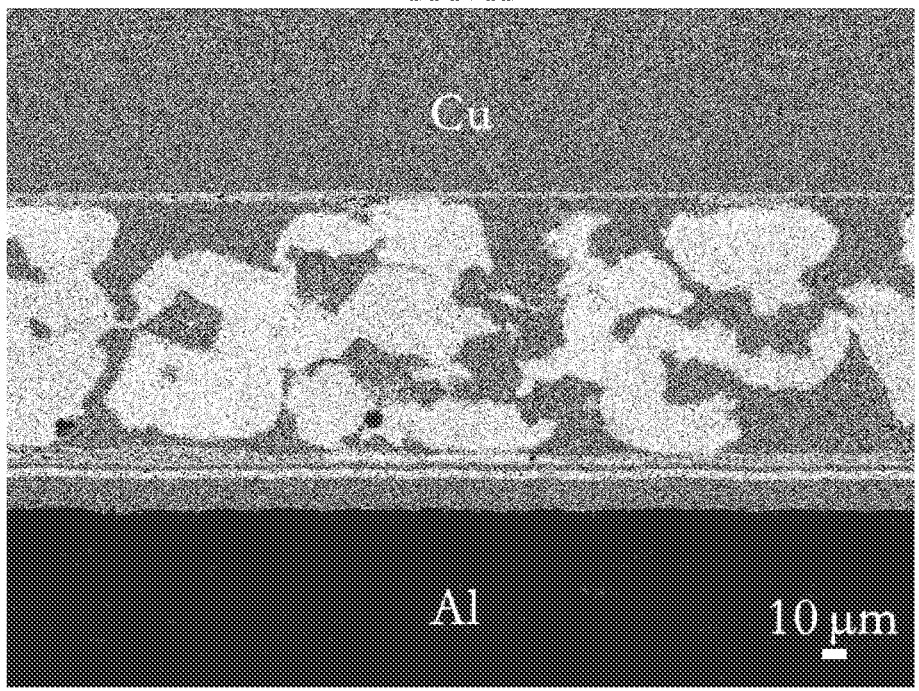
FIG. 12 shows a microstructure of a Cu/Sn-58Bi/metal-foam metal composite material/Sn-58Bi/Al soldering interface formed in Example 5 of the present disclosure.

Step 3: the interconnect structure was put to a reflow soldering device and soldered in vacuum at a reflow soldering temperature of 170° C. for 5 min. The obtained interconnect structure has a microstructure as shown in FIG. 12.

The remelting temperature of the interconnect structure was determined, being about 175° C. After being soldered, the metal-foam metal composite material layer containing Bi had a thermal conductivity of 89.5 W/m·K.

Example 6

Figure 13:
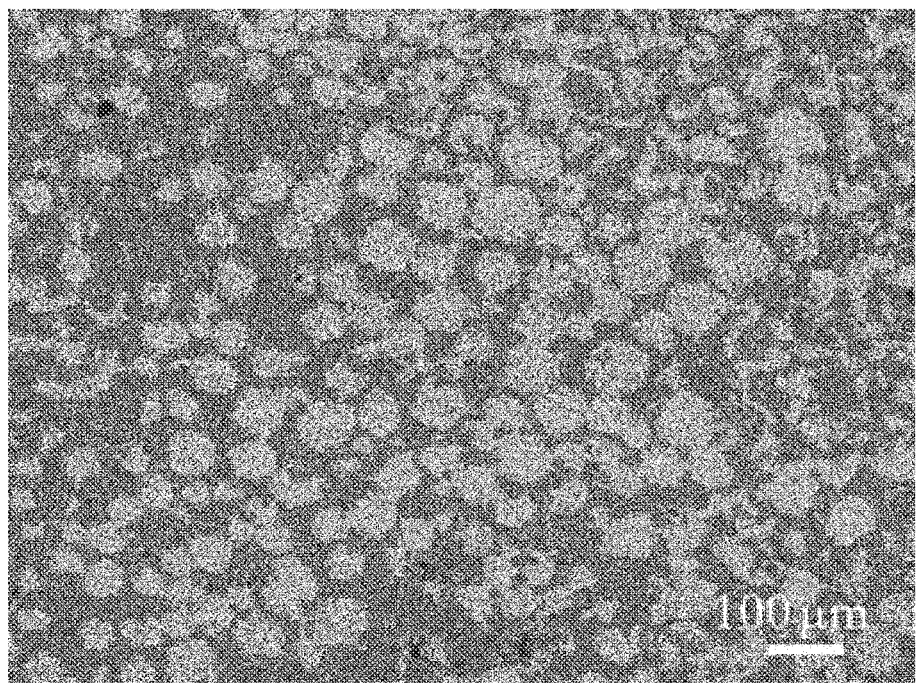
FIG. 13 shows a microstructure of a metal-foam metal composite material prepared in step 1 of Example 6 of the present disclosure.

The interface interconnect structure for efficient heat dissipation of a power electronic device and the preparation method therefor may be achieved by the following steps:

Step 1: preparation of a metal-foam metal composite material: a porous metal Cu having a thickness of 130 μm, a porosity of 50% and a pore size of 30 μm and pure Sn (melting point: 232° C.) were selected separately to prepare the metal-foam metal composite material; the selected porous metal Cu was cleaned in acetone for 5-10 min, and subjected to vacuum drying and soaked into a liquid fluxing agent, and then soaked into molten Sn for 10 s, and then taken out, and cooled to obtain the metal-foam metal composite material. The microstructure is shown in FIG. 13. Measured by a thermal conductivity meter (Hot Disk TPS2500), the thermal conductivity and the CTE at 150° C. of the prepared metal-foam metal composite material were 109.3 W/m·K and 16.5 ppm/° C., respectively.

Step 2: 10 μm of a Sn-58Bi (melting point: 138° C.) solder paste was selected as a low temperature solder layer, pure Cu was selected as an upper substrate and pure Al (a radiator) served as a lower substrate; then the upper low temperature solder layer Sn-58Bi, the metal-foam metal composite material, and the lower low temperature solder layer Sn-58Bi were placed between both sides of the substrates, to form an interconnect structure.

Figure 14:
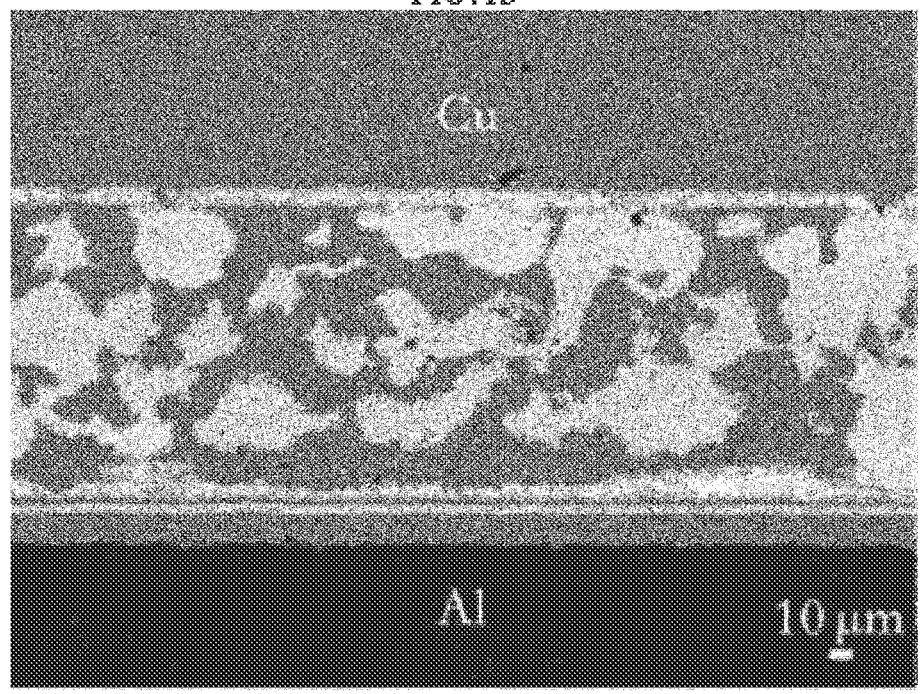
FIG. 14 shows a microstructure of a Cu/Sn-58Bi/metal-foam metal composite material/Sn-58Bi/Al soldering interface formed in Example 6 of the present disclosure.

Step 3: the interconnect structure was put to a reflow soldering device and soldered in vacuum at a reflow soldering temperature of 170° C. for 5 min. The obtained interconnect structure has a microstructure as shown in FIG. 14.

The remelting temperature of the interconnect structure was determined, being about 197° C. After being soldered, the metal-foam metal composite material layer containing Bi had a thermal conductivity of 102.8 W/m·K.

Example 7

The interface interconnect structure for efficient heat dissipation of a power electronic device and the preparation method therefor may be achieved by the following steps:

Step 1: preparation of a metal-foam metal composite material: a porous metal Cu having a thickness of 120 μm, a porosity of 65% and a pore size of 60 μm and pure Sn (melting point: 232° C.) were selected to prepare the metal-foam metal composite material; the selected porous metal Cu was cleaned in acetone for 5-10 min, and subjected to vacuum drying and soaked into a liquid fluxing agent, and then soaked into molten Sn for 10 s, and then taken out, and cooled to obtain the metal-foam metal composite material. The microstructure is shown in FIG. 9. Measured by a thermal conductivity meter (Hot Disk TPS2500), the thermal conductivity and the CTE at 150° C. of the prepared metal-foam metal composite material were 86.9 W/m·K and 18.5 ppm/° C., respectively (FIG. 7).

Step 2: 10 μm of a Sn-57Bi-1Ag (melting point: 139° C.) preformed sheet was selected as a low temperature solder layer, pure Cu was selected as an upper substrate and pure Al (heat sink) served as a lower substrate; then the upper low temperature solder layer Sn-57Bi-1Ag, the metal-foam metal composite material, and the lower low temperature solder layer Sn-57Bi-1Ag were placed between both sides of the substrates, to form an interconnect structure.

Figure 15:
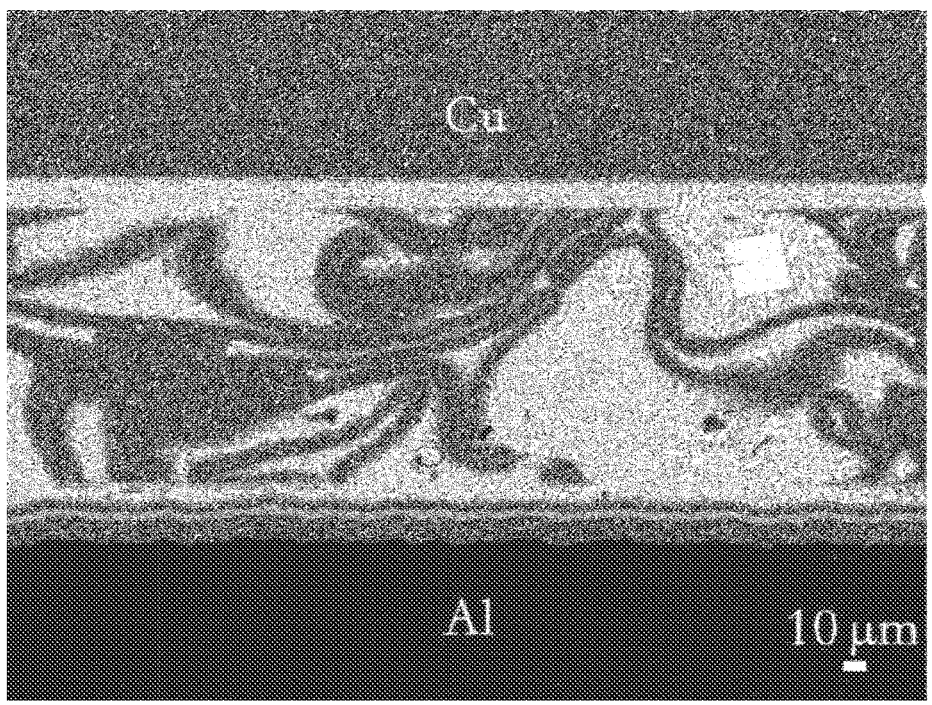
FIG. 15 shows a microstructure of a Cu/Sn-57Bi-1Ag/metal-foam metal composite material/Sn-57Bi-1Ag/Al soldering interface formed in Example 7 of the present disclosure.

Step 3: the interconnect structure was put to a reflow soldering device and soldered in vacuum at a reflow soldering temperature of 160° C. for 6 min. The obtained interconnect structure has a microstructure as shown in FIG. 15.

The remelting temperature of the interconnect structure was determined, being about 178° C. After being soldered, the metal-foam metal composite material layer containing Bi had a thermal conductivity of 92.8 W/m·K.

Example 8

The interface interconnect structure for efficient heat dissipation of a power electronic device and the preparation method therefor may be achieved by the following steps:

Step 1: preparation of a metal-foam metal composite material: a porous metal Cu having a thickness of 200 μm, a porosity of 65% and a pore size of 60 μm and pure Sn (melting point: 232° C.) were selected to prepare the metal-foam metal composite material; the selected porous metal Cu was cleaned in acetone for 5-10 min, and subjected to vacuum drying and soaked into a liquid fluxing agent, and then soaked into molten Sn for 10 s, and then taken out, and cooled to obtain the metal-foam metal composite material. The microstructure is shown in FIG. 9. Measured by a thermal conductivity meter (Hot Disk TPS2500), the thermal conductivity and the CTE at 150° C. of the prepared metal-foam metal composite material were 86.9 W/m·K and 18.5 ppm/° C., respectively.

Step 2: 15 μm of a Sn-52In (melting point: 118° C.) preformed sheet was selected as a low temperature solder layer, an IGBT module commonly used for new energy automobile was selected as an upper substrate with a Sn coating as a surface treatment layer of the surface to be soldered, and pure Al (heat sink) served as a lower substrate; then the upper low temperature solder layer Sn-52In, the metal-foam metal composite material, and the lower low temperature solder layer Sn-52In were placed between both sides of the substrates, to form an interconnect structure.

Figure 16:
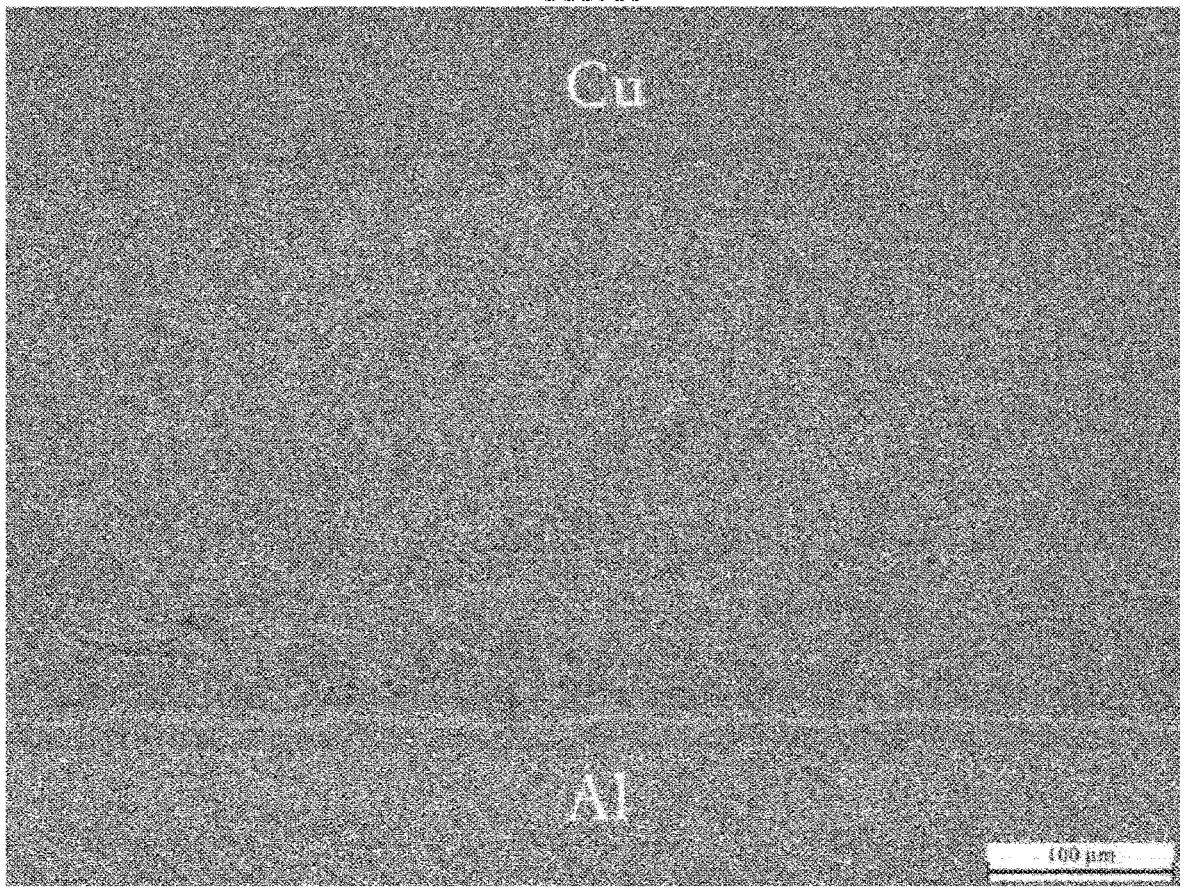
FIG. 16 shows a microstructure of an IGBT module/Sn-52In/metal-foam metal composite material/Sn-52In/Al soldering interface formed in Example 8 of the present disclosure.
Figure 17:
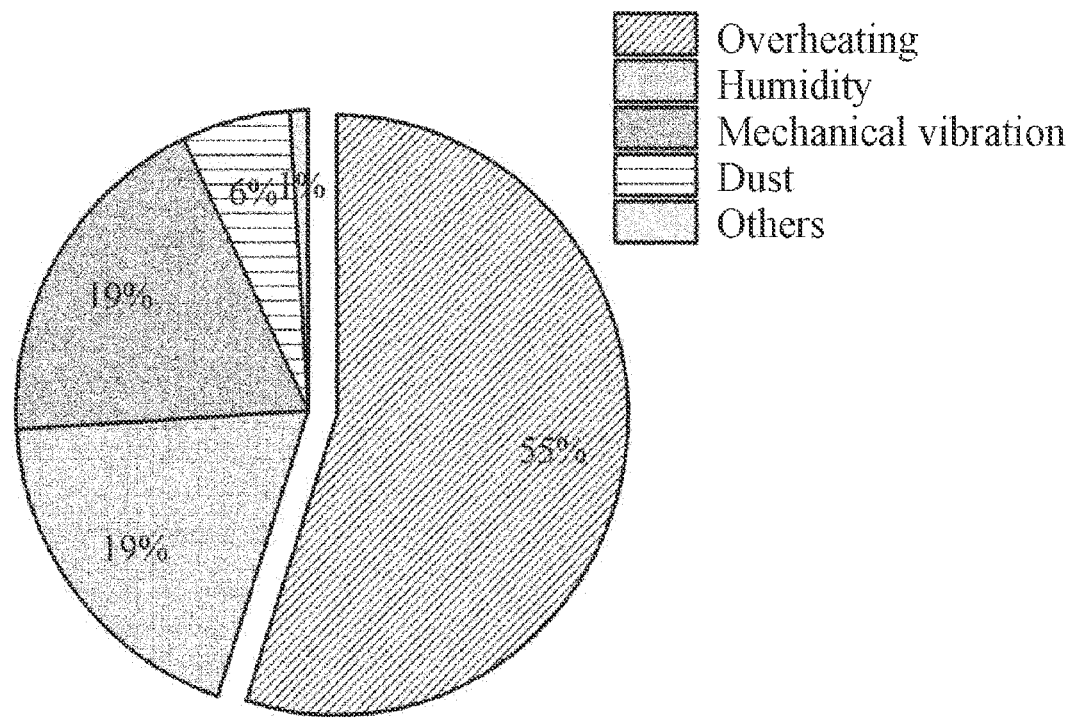
FIG. 17 shows a graphical plot of proportional distribution of IGBT failure factors.
Figure 18:
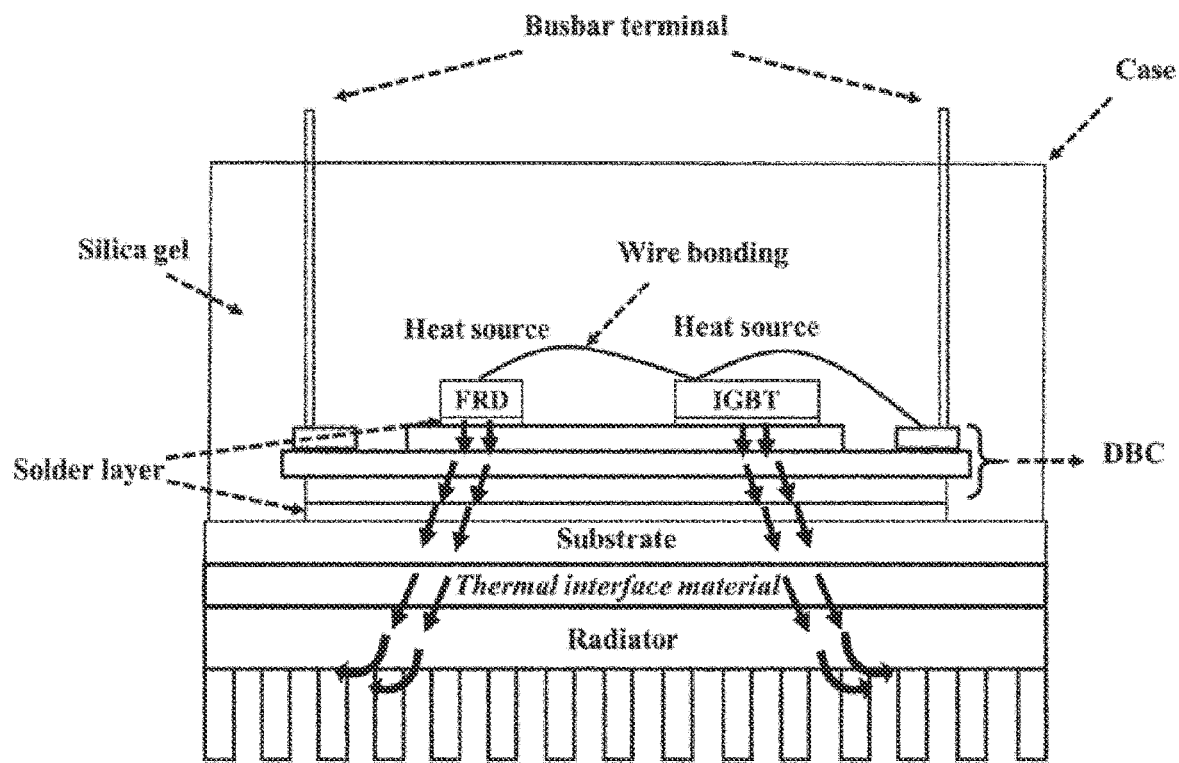
FIG. 18 is a schematic diagram showing a heat dissipation path of an IGBT power electronic device.
Figure 19:
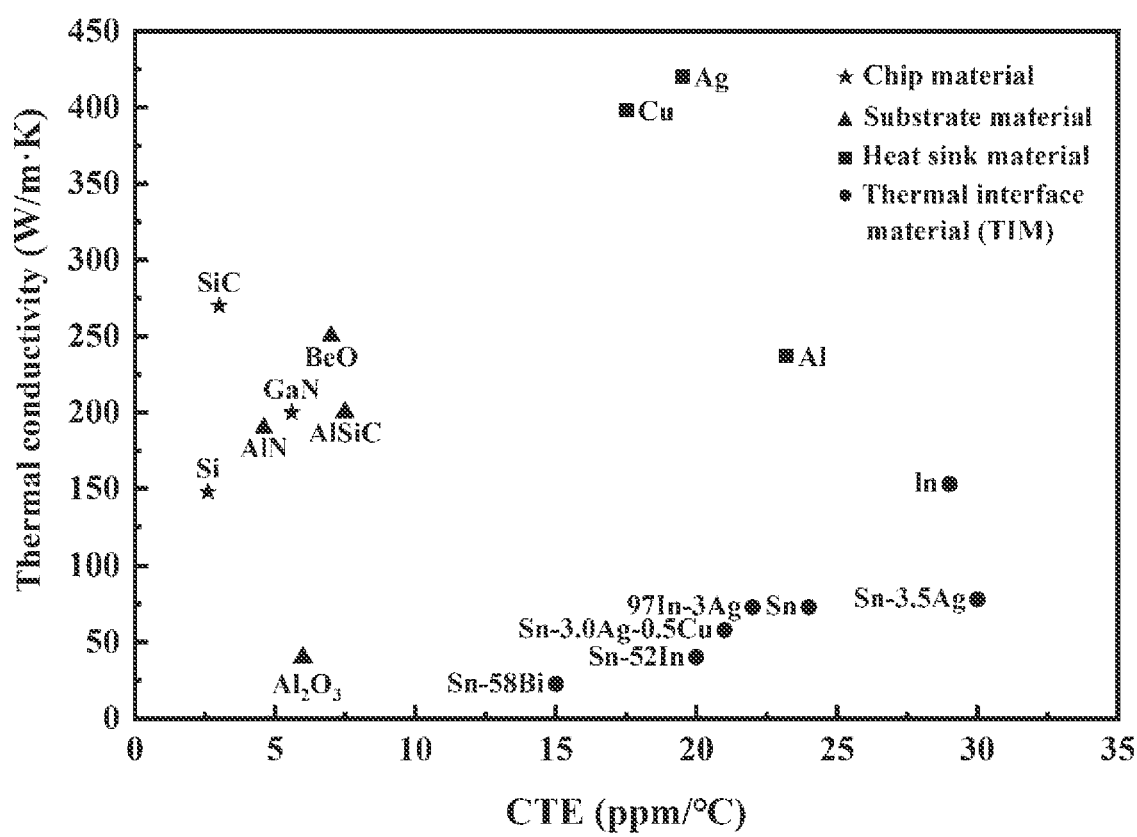
FIG. 19 shows CTEs of encapsulating materials for a power electronic device.

Step 3: the interconnect structure was put to a reflow soldering device and soldered in vacuum at a reflow soldering temperature of 150° C. for 6 min. The obtained interconnect structure has a microstructure as shown in FIG. 16.

The remelting temperature of the interconnect structure was determined, being about 180° C. After being soldered, the metal-foam metal composite material layer containing Bi had a thermal conductivity of 80.8 W/m·K.

Example 9

The interface interconnect structure for efficient heat dissipation of a power electronic device and the preparation method therefor may be achieved by the following steps:

Step 1: preparation of a metal-foam metal composite material: a porous metal Cu having a thickness of 200 μm, a porosity of 65% and a pore size of 30 μm and Sn-3.5Ag (melting point: 221° C.) were selected to prepare the metal-foam metal composite material; the selected porous metal Cu was cleaned in acetone for 5-10 min, and subjected to vacuum drying and soaked into a liquid fluxing agent, and then soaked into molten Sn-3.5Ag for 10 s, and then taken out, and cooled to obtain the metal-foam metal composite material. The microstructure is similar to that of the metal-foam metal composite material in Example 8, and thus not described any more. Determined by a thermal conductivity meter (Hot DiskTPS2500), the thermal conductivity and the CTE at 150° C. of the prepared metal-foam metal composite material were 93.2 W/m·K and 24 ppm/° C., respectively.

Step 2: 10 μm of a Sn-58Bi (melting point: 138° C.) preformed sheet was selected as a low temperature solder layer, pure Cu was selected as an upper substrate and pure Al (heat sink) served as a lower substrate; then the upper low temperature solder layer Sn-58Bi, the metal-foam metal composite material, and the lower low temperature solder layer Sn-58Bi were placed between both sides of the substrates, to form an interconnect structure.

Step 3: the interconnect structure was put to a reflow soldering device and soldered in vacuum at a reflow soldering temperature of 170° C. for 5 min.

The remelting temperature of the interconnect structure was determined, being about 192° C. After being soldered, the metal-foam metal composite material layer containing Bi had a thermal conductivity of 86.5 W/m·K.

Example 10

The interface interconnect structure for efficient heat dissipation of a power electronic device and the preparation method therefor may be achieved by the following steps:

Step 1: preparation of a metal-foam metal composite material: a porous metal Cu having a thickness of 300 μm, a porosity of 90% and a pore size of 100 μm and Sn-3.0Ag-0.5Cu (melting point: 217° C.) were selected to prepare the metal-foam metal composite material; the selected porous metal Cu was cleaned in acetone for 5-10 min, and subjected to vacuum drying and soaked into a liquid fluxing agent, and then soaked into molten Sn-3.0Ag-0.5Cu for 15 s, and then taken out, and cooled to obtain the metal-foam metal composite material. The microstructure is similar to that of the metal-foam metal composite material in Example 8, and thus not described any more. Determined by a thermal conductivity meter (Hot TPS2500), the thermal conductivity and the CTE at 150° C. of the prepared metal-foam metal composite material were 79 W/m·K and 20 ppm/° C., respectively.

Step 2: 20 μm of a Sn-57Bi-1Ag (melting point: 139° C.) solder paste was selected as a low temperature solder layer, pure Cu was selected as an upper substrate and pure Cu (heat sink) served as a lower substrate; then the upper low temperature solder layer Sn-57Bi-1Ag, the metal-foam metal composite material, and the lower low temperature solder layer Sn-57Bi-1Ag were placed between both sides of the substrates, to form an interconnect structure.

Step 3: the interconnect structure was put to a reflow soldering device and soldered in vacuum at a reflow soldering temperature of 160° C. for 5 min.

The remelting temperature of the interconnect structure was determined, being about 201° C. After being soldered, the thermal interface interconnect structure had a thermal conductivity of 75 W/m·K.

Example 11

The interface interconnect structure for efficient heat dissipation of a power electronic device and the preparation method therefor may be achieved by the following steps:

Step 1: preparation of a metal-foam metal composite material: a porous metal Ag having a thickness of 400 μm, a porosity of 30% and a pore size of 120 μm and Sn (melting point: 232° C.) were selected to prepare the metal-foam metal composite material; the selected porous metal Ag was cleaned in acetone for 5-10 min, and subjected to vacuum drying and soaked into a liquid fluxing agent, and then soaked into molten Sn for 10 s, and then taken out, and cooled to obtain the metal-foam metal composite material. The microstructure is similar to that of the metal-foam metal composite material in Example 8, and thus not described any more. Determined by a thermal conductivity meter (Hot TPS2500), the thermal conductivity and the CTE at 150° C. of the prepared metal-foam metal composite material were 221 W/m·K and 22 ppm/° C., respectively.

Step 2: 20 μm of a Sn-57Bi-1Ag (melting point: 139° C.) solder paste was selected as a low temperature solder layer, pure Cu was selected as an upper substrate and pure Cu (heat sink) served as a lower substrate; then the upper low temperature solder layer Sn-57Bi-1Ag, the metal-foam metal composite material, and the lower low temperature solder layer Sn-57Bi-1Ag were placed between both sides of the substrates, to form an interlinked structure.

Step 3: the interconnect structure was put to a reflow soldering device and soldered in vacuum at a reflow soldering temperature of 160° C. for 6 min.

The remelting temperature of the interconnect structure was determined, being about 190° C. After being soldered, the thermal interface interconnect structure had a thermal conductivity of 189 W/m·K.

Example 12

The interface interconnect structure for efficient heat dissipation of a power electronic device and the preparation method therefor may be achieved by the following steps:

Step 1: preparation of a metal-foam metal composite material: a porous metal Ag having a thickness of 500 μm, a porosity of 80% and a pore size of 200 μm and Sn (melting point: 232° C.) were selected to prepare the metal-foam metal composite material; the selected porous metal Ag was cleaned in acetone for 5-10 min, and subjected to vacuum drying and soaked into a liquid fluxing agent, and then soaked into molten Sn for 10 s, and then taken out, and cooled to obtain the metal-foam metal composite material. The microstructure is similar to that of the metal-foam metal composite material in Example 8, and thus not described any more. Determined by a thermal conductivity meter (Hot TPS2500), the thermal conductivity and the CTE at 150° C. of the prepared metal-foam metal composite material were 162 W/m·K and 25 ppm/° C., respectively.

Step 2: 50 μm of a Sn-58Bi (melting point: 138° C.) solder paste was selected as a low temperature solder layer, pure Cu was selected as an upper substrate and pure Cu (heat sink) served as a lower substrate; then the upper low temperature solder layer Sn-58Bi, the metal-foam metal composite material, and the lower low temperature solder layer Sn-58Bi were placed between both sides of the substrates, to form an interconnect structure.

Step 3: the interconnect structure was put to a reflow soldering device and soldered in vacuum at a reflow soldering temperature of 160° C. for 6 min.

The remelting temperature of the interconnect structure was determined, being about 200° C. After being soldered, the thermal interface interconnect structure had a thermal conductivity of 131 W/m·K.

Therefore, all the interface interconnect structures in Examples 1-12 may achieve "low temperature soldering and high temperature service"; the thermal conductivity and CTE may be adjusted. In practical use, the specific embodiment was determined on the basis of an equivalent CTE of a part to be interconnected, so as to complete a reasonable CTE match.

The above descriptions are merely preferred implementations of the present disclosure. It should be noted that a person of ordinary skill in the art may further make several improvements and modifications without departing from the principle of the present disclosure, but such improvements and modifications should be deemed as falling within the protection scope of the present disclosure.

What is claimed is:

1. An interface interconnect structure for efficient heat dissipation of a power electronic device, wherein the interface interconnect structure comprises:

a first low temperature solder layer and a second low temperature solder layer; a metal-foam metal composite material is placed between the first low temperature solder layer and the second low temperature solder layer; the first low temperature solder layer is located between an upper substrate and the metal-foam metal composite material; the second low temperature solder layer is located between the metal-foam metal composite material and a lower substrate; the first low temperature solder layer and the second low temperature solder layer have a preset thickness; the first low temperature solder layer and the second low temperature solder layer are a low temperature solder preformed sheet, and a fluxing agent is coated at both sides of the low temperature preformed sheet; the metal-foam metal composite material comprises a high-melting high-thermal-conductive porous metal and a medium-high temperature lead-free solder, and has a preset thickness, a preset thermal conductivity, and a preset coefficient of thermal expansion (CTE); a ratio of the high-melting high-thermal-conductive porous metal to the medium-high temperature lead-free solder in the metal-foam metal composite material is adjusted such that the interface interconnect structure has a thermal conductivity of 60-250 W/m·K and a CTE of 12-25 ppm/° C.; a remelting temperature of the interface interconnect structure is adjusted to a preset value by selecting metal-foam metal composite materials with different physical and chemical properties as well as first low temperature solder layers and second low temperature solder layers that each have different physical and chemical properties; in a process of reflow soldering and subsequent service, melting point depressant elements in the first low temperature solder layer and the second low temperature solder layer are subjected to bidirectional diffusion with the medium-high temperature lead-free solder in the metal-foam metal composite material such that the remelting temperature of the interface interconnect structure is greater than melting points of the first low temperature solder layer and the second low temperature solder layer, and less than a melting point of the medium-high temperature lead-free solder in the metal-foam metal composite material, to achieve low temperature soldering and high temperature service.

2. The interface interconnect structure of claim 1, wherein physical and chemical properties of the metal-foam metal composite material comprise a porosity, a pore size, a thickness and a material of the high-melting high-thermal-conductive porous metal as well as a composition of the medium-high temperature lead-free solder;

wherein the medium-high temperature lead-free solder comprises a component selected from a group consisting of: any one of pure Sn, Sn—Ag—Cu, Sn—Ag, Sn—Cu, and Au—Sn, or an alloy that is formed by adding any one of Ni, Sb, and Zn to the above component, and has a melting point of greater than 200° C. and a thermal conductivity of greater than 20 W/m·K; a metallic matrix of the high-melting high-thermal-conductive porous metal comprises Cu, Ag, Al, and Mg; the high-melting high-thermal-conductive porous metal has a porosity of 20-90% and a pore size of 20-200 μm; and the metal-foam metal composite material has a thickness of 20-500 μm.

3. The interface interconnect structure of claim 1, wherein the first low temperature solder layers and second low temperature solder layer that each have different physical and chemical properties are selected based on a thickness and a material of the first low temperature solder layer and the second low temperature solder layer;

wherein the first low temperature solder layer and the second low temperature solder layer each have a thickness of 5-50 μm; a low temperature solder in each of the first low temperature solder layer and the second low temperature solder layer comprises a component selected from a group consisting of: any one of Sn—Bi, Sn—In, Sn—Bi—In, and Ag—In, or is formed by adding any one of Cu, Ag, Ga, and Sb to the above component such that the metal-foam metal composite material is not molten within a soldering temperature range of the low temperature solder; and the first low temperature solder layer and the second low temperature solder layer are the same or different.

4. A method for preparing an interface interconnect structure for efficient heat dissipation of a power electronic device, wherein the interface interconnect structure comprises a first low temperature solder layer and a second low temperature solder layer; a metal-foam metal composite material is placed between the first low temperature solder layer and the second low temperature solder layer; the first low temperature solder layer is located between an upper substrate and the metal-foam metal composite material; the second low temperature solder layer is located between the metal-foam metal composite material and a lower substrate; the first low temperature solder layer and the second low temperature solder layer have a preset thickness; the first low temperature solder layer and the second low temperature solder layer are a low temperature solder preformed sheet, and a fluxing agent is coated at both sides of the low temperature preformed sheet; the metal-foam metal composite material comprises a high-melting high-thermal-conductive porous metal and a medium-high temperature lead-free solder, and has a preset thickness, a preset thermal conductivity, and a preset coefficient of thermal expansion (CTE); a ratio of the high-melting high-thermal-conductive porous metal to the medium-high temperature lead-free solder in the metal-foam metal composite material is adjusted such that the interface interconnect structure has a thermal conductivity of 60-250 W/m·K and a CTE of 12-25 ppm/° C.; a remelting temperature of the interface interconnect structure is adjusted to a preset value by selecting metal-foam metal composite materials with different physical and chemical properties as well as first low temperature solder layers and second low temperature solder layers that each have different physical and chemical properties; in a process of reflow soldering and subsequent service, melting point depressant elements in the first low temperature solder layer and the second low temperature solder layer are subjected to bidirectional diffusion with the medium-high temperature lead-free solder in the metal-foam metal composite material such that the remelting temperature of the interface interconnect structure is greater than melting points of the first low temperature solder layer and the second low temperature solder layer, and less than a melting point of the medium-high temperature lead-free solder in the metal-foam metal composite material, to achieve low temperature soldering and high temperature service, the method specifically comprising:

step 1: preparing the metal-foam metal composite material, and cleaning the selected high-melting high-thermal-conductive porous metal in acetone or ethanol for 5-10 min, soaking into a liquid fluxing agent after vacuum drying, and soaking into a molten medium-high temperature lead-free solder, and taking out, then cooling to form the metal-foam metal composite material;

step 2: placing the metal-foam metal composite material between the first low temperature solder layer and the second low temperature solder layer, to form an interconnect structure of the upper substrate/the first low temperature solder layer/the metal-foam metal composite material/the second low temperature solder layer/the lower substrate from top to bottom;

step 3: putting the interconnect structure of the upper substrate/the first low temperature solder layer/the metal-foam metal composite material/the second low temperature solder layer/the lower substrate to a reflow soldering device, and performing reflow soldering under a protective atmosphere according to a required process time and temperature, wherein the method thereby produces the interface interconnect structure of claim 1.

5. The method of claim 4, wherein physical and chemical properties of the metal-foam metal composite material comprise a porosity, a pore size, a thickness and a material of a high-melting high-thermal-conductive porous metal as well as composition of the medium-high temperature lead-free solder;
    wherein the medium-high temperature lead-free solder comprises a component selected from a group consisting of: any one of pure Sn, Sn—Ag—Cu, Sn—Ag, Sn—Cu, and Au—Sn, or an alloy that is formed by adding any one of Ni, Sb, and Zn to the above component, and has a melting point of greater than 200° C. and a thermal conductivity of greater than 20 W/m·K; a metallic matrix of the high-melting high-thermal-conductive porous metal comprises Cu, Ag, Al, and Mg; the high-melting high-thermal-conductive porous metal has a porosity of 20-90% and a pore size of 20-200 μm; and the metal-foam metal composite material has a thickness of 20-500 μm.

6. The method of claim 5, wherein in the step 1, the high-melting high-thermal-conductive porous metal is soaked into the liquid fluxing agent for 1-2 min, and the high-melting high-thermal-conductive porous metal is soaked into the molten medium-high temperature lead-free solder for 5 s-1 min.

7. The method of claim 5, wherein in the step 2, the upper substrate is a power electronic device selected from a group consisting of: a metal-oxide semiconductor field effect transistor (MOSFET) discrete device, an insulated gate bipolar transistor (IGBT) power module, and a wide band gap (WBG) semiconductor device; and the lower substrate is a heat sink material for a power electronic device that is selected from the group consisting of aluminum, copper, and a copper alloy.

8. The method of claim 4, wherein the first low temperature solder layers and second low temperature solder layer that each have different physical and chemical properties are selected based on a thickness and a material of the first low temperature solder layer and the second low temperature solder layer;
    wherein the first low temperature solder layer and the second low temperature solder layer each have a thickness of 5-50 μm; a low temperature solder in each of the first low temperature solder layer and the second low temperature solder layer comprises a component selected from a group consisting of: any one of Sn—Bi, Sn—In, Sn—Bi—In, and Ag—In, or is formed by adding any one of Cu, Ag, Ga, and Sb to the above component such that the metal-foam metal composite material is not molten within a soldering temperature range of the low temperature solder; and the first low temperature solder layer and the second low temperature solder layer are the same or different.

9. The method of claim 8, wherein in the step 1, the high-melting high-thermal-conductive porous metal is soaked into the liquid fluxing agent for 1-2 min, and the high-melting high-thermal-conductive porous metal is soaked into the molten medium-high temperature lead-free solder for 5 s-1 min.

10. The method of claim 8, wherein in the step 2, the upper substrate is a power electronic device selected from a group consisting of: a metal-oxide semiconductor field effect transistor (MOSFET) discrete device, an insulated gate bipolar transistor (IGBT) power module, and a wide band gap (WBG) semiconductor device; and the lower substrate is a heat sink material for a power electronic device that is selected from the group consisting of aluminum, copper, and a copper alloy.

11. The method of claim 4, wherein in the step 1, the high-melting high-thermal-conductive porous metal is soaked into the liquid fluxing agent for 1-2 min, and the high-melting high-thermal-conductive porous metal is soaked into the molten medium-high temperature lead-free solder for 5 s-1 min.

12. The method of claim 4, wherein in the step 2, the upper substrate is a power electronic device selected from a group consisting of: a metal-oxide semiconductor field effect transistor (MOSFET) discrete device, an insulated gate bipolar transistor (IGBT) power module, and a wide band gap (WBG) semiconductor device; and the lower substrate is a heat sink material for a power electronic device that is selected from the group consisting of aluminum, copper, and a copper alloy.

13. The method of claim 4, wherein in the step 3, wherein a reflow soldering temperature ranges above highest melting points of the first low temperature solder layer and the second low temperature solder layer, and is 10-50° C. higher than a melting point of a low temperature solder; and a reflow soldering time is 30 s-10 min.

14. The method of claim 4, wherein in the step 3, the obtained interface interconnect structure for efficient heat dissipation based on the metal-foam metal composite material is capable of working at a temperature that is greater than melting points of the first low temperature solder layer and the second low temperature solder layer and is less than a melting point of the medium-high temperature lead-free solder in the metal-foam metal composite material.

15. An interface interconnect structure for efficient heat dissipation of a power electronic device, wherein the interface interconnect structure comprises:
    a first low temperature solder layer and a second low temperature solder layer; a metal-foam metal composite material is placed between the first low temperature solder layer and the second low temperature solder layer; the first low temperature solder layer is located between an upper substrate and the metal-foam metal composite material; the second low temperature solder layer is located between the metal-foam metal composite material and a lower substrate; the first low temperature solder layer and the second low temperature solder layer have a preset thickness; the first low temperature solder layer and the second low temperature solder layer each are a low temperature solder paste that is coated on the upper substrate and the lower substrate in a steel mesh printing way; the metal-foam metal composite material comprises a high-melting high-thermal-conductive porous metal and a medium-high temperature lead-free solder, and has a preset thickness, a preset thermal conductivity, and a preset coefficient of thermal expansion (CTE); a ratio of the high-melting high-thermal-conductive porous metal to the medium-high temperature lead-free solder in the metal-foam metal composite material is adjusted such that the interface interconnect structure has a thermal conductivity of 60-250 W/m·K and a CTE of 12-25 ppm/° C.; a remelting temperature of the interface interconnect structure is adjusted to a preset value by selecting metal-foam metal composite materials with different physical and chemical properties as well as first low temperature solder layers and second low temperature solder layers that each have different physical and chemical properties; in a process of reflow soldering and subsequent service, melting point depressant elements in the first low temperature solder layer and the second low temperature solder layer are subjected to bidirectional diffusion with the medium-high temperature lead-free solder in the metal-foam metal composite material such that the remelting temperature of the interface interconnect structure is greater than melting points of the first low temperature solder layer and the second low temperature solder layer, and less than a melting point of the medium-high temperature lead-free solder in the metal-foam metal composite material, to achieve low temperature soldering and high temperature service.

\* \* \* \* \*